(12) United States Patent
Kato

(10) Patent No.: US 9,847,171 B2
(45) Date of Patent: Dec. 19, 2017

(54) FLEXIBLE CABLE AND ELECTRONIC DEVICE

(71) Applicant: Murata Manufacturing Co., Ltd., Nagaokakyo-shi, Kyoto-fu (JP)

(72) Inventor: Noboru Kato, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 105 days.

(21) Appl. No.: 14/926,444

(22) Filed: Oct. 29, 2015

(65) Prior Publication Data

US 2016/0049240 A1 Feb. 18, 2016

Related U.S. Application Data

(63) Continuation of application No. PCT/JP2014/062132, filed on May 2, 2014.

(30) Foreign Application Priority Data

Jun. 17, 2013 (JP) .................................. 2013-126863

(51) Int. Cl.
  *H01G 4/228* (2006.01)
  *H01G 4/005* (2006.01)
  (Continued)

(52) U.S. Cl.
  CPC ............... *H01G 4/002* (2013.01); *H01G 4/14* (2013.01); *H01G 4/228* (2013.01); *H01G 4/26* (2013.01);
  (Continued)

(58) Field of Classification Search
  CPC ............. H01G 4/02; H01G 4/26; H01G 4/002
  (Continued)

(56) References Cited

U.S. PATENT DOCUMENTS

| | | | | |
|---|---|---|---|---|
| 6,212,057 B1* | 4/2001 | Kohara | ..................... | H01G 4/08 361/301.4 |
| 2009/0268368 A1* | 10/2009 | Fuhrmann | ................ | H01G 4/32 361/301.5 |
| 2013/0148255 A1* | 6/2013 | Taylor | .................... | H01G 4/015 361/275.4 |

FOREIGN PATENT DOCUMENTS

| | | |
|---|---|---|
| JP | 52-146858 A | 12/1977 |
| JP | 55-14716 U | 1/1980 |

(Continued)

OTHER PUBLICATIONS

Official Communication issued in International Patent Application No. PCT/JP2014/062132, dated Aug. 12, 2014.

(Continued)

*Primary Examiner* — Eric Thomas
*Assistant Examiner* — Arun Ramaswamy
(74) *Attorney, Agent, or Firm* — Keating & Bennett, LLP

(57) ABSTRACT

A flexible cable includes an elongated flexible substrate including first and second surfaces on opposite sides thereof, a first capacitor electrode provided on the first surface side of the flexible substrate, the first capacitor electrode extending from a first end of the flexible substrate toward a second end of the flexible substrate, a second capacitor electrode provided on the second surface side of the flexible substrate, the second capacitor electrode extending from the second end of the flexible substrate toward the first end of the flexible substrate, a first connection portion provided at an end of the first capacitor electrode located at the first end of the flexible substrate, and a second connection portion provided at an end of the second capacitor electrode located at the second end of the flexible substrate.

18 Claims, 8 Drawing Sheets

(51) Int. Cl.
    *H01G 4/00*     (2006.01)
    *H01G 4/30*     (2006.01)
    *H01G 4/002*     (2006.01)
    *H01G 4/33*     (2006.01)
    *H01G 4/14*     (2006.01)
    *H05K 1/18*     (2006.01)
    *H01G 4/26*     (2006.01)
    *H05K 1/16*     (2006.01)

(52) U.S. Cl.
    CPC ............... *H01G 4/33* (2013.01); *H05K 1/189* (2013.01); *H05K 1/162* (2013.01); *H05K 2201/055* (2013.01); *H05K 2201/09309* (2013.01); *H05K 2201/10189* (2013.01)

(58) Field of Classification Search
    USPC ................ 361/301.4, 301.1, 306.1, 329, 303
    See application file for complete search history.

(56) References Cited

FOREIGN PATENT DOCUMENTS

| JP | 10-4030 A | 1/1998 |
|---|---|---|
| JP | 2000-77796 A | 3/2000 |
| JP | 2000-114090 A | 4/2000 |
| JP | 2000-357631 A | 12/2000 |

OTHER PUBLICATIONS

Official Communication issued in corresponding Japanese Patent Application No. 2015-522644, dated Sep. 27, 2016.

* cited by examiner

FLEXIBLE CABLE AND ELECTRONIC DEVICE

BACKGROUND OF THE INVENTION

1. Field of the Invention

The present invention relates to a flexible cable and more particularly to a flexible cable including a capacitor element and including a structure that electrically connects circuit boards, and an electronic device including the flexible cable.

2. Description of the Related Art

With regard to recent mobile terminals, a plurality of circuit boards are incorporated in each mobile terminal, and cables are needed to connect these circuit boards to one another. Such a cable is preferred to be flexible in view of cable arrangement. Also, such a cable is preferred to include a passive element, such as a capacitor, as well as to function as an electrical connector.

As an example of conventional flexible capacitors, a flexible thin-film capacitor as disclosed in Japanese Patent Laid-Open Publication No. 2000-357631 is known. However, since this flexible thin-film capacitor includes a plurality of electrode films and dielectric layers stacked on one another, its flexibility is not necessarily high, and the production process thereof is complicated. Also, since the distance between terminals of the flexible thin-film capacitor is short, it is difficult to form a capacitor having great capacitance.

SUMMARY OF THE INVENTION

Preferred embodiments of the present invention provide a flexible cable with a simple structure and sufficient flexibility, being easy to produce, including a capacitor element with great capacitance, and also provide an electronic device.

According to a first aspect of various preferred embodiments of the present invention, a flexible cable an elongated flexible substrate including a first surface and a second surface on opposite sides thereof; a first capacitor electrode provided on the first surface of the flexible substrate, the first capacitor electrode extending from a first end of the flexible substrate toward a second end of the flexible substrate; a second capacitor electrode provided on the second surface of the flexible substrate, the second capacitor electrode extending from the second end of the flexible substrate toward the first end of the flexible substrate; a first connection portion provided at an end of the first capacitor electrode located at the first end of the flexible substrate; and a second connection portion provided at an end of the second capacitor electrode located at the second end of the flexible substrate.

According to a second aspect of various preferred embodiments of the present invention, an electronic device includes the flexible cable; a first circuit element which the first connection portion is connected to; and a second circuit element which the second connection portion is connected to.

The first connection portion and the second connection portion of the flexible cable are connected to specified wirings of circuit boards, respectively. Thus, the flexible cable connects wirings provided on one or more circuit boards to each other while providing a capacitor element. The flexible cable includes a laminate structure including an elongated flexible substrate, and first and second capacitor electrodes provided on the first and the second surfaces, respectively, of the flexible substrate. Accordingly, the flexible cable has a simple structure, has high flexibility, and is easy to produce. Also, it is possible to increase the capacitance value of the capacitor element by increasing the length and/or the width of the flexible substrate.

Thus, various preferred embodiments of the present invention provide a flexible cable with a simple structure and sufficient flexibility, being easy to produce, and including a capacitor element with great capacitance, and provide an electronic device.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
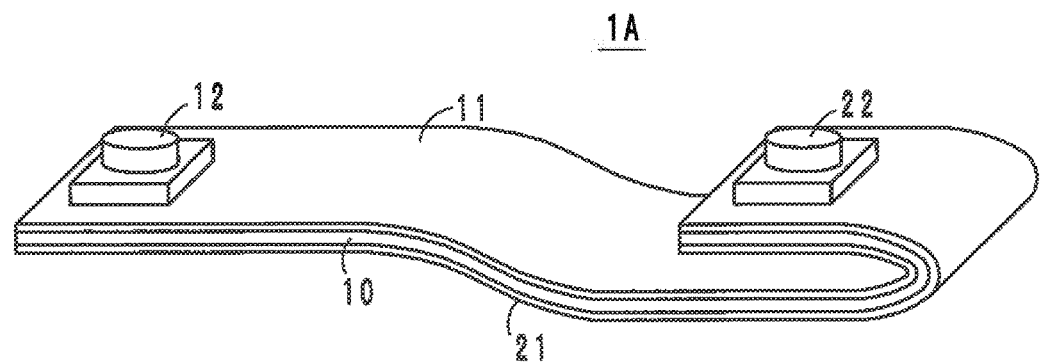
FIGS. 1A, 1B and 1C illustrate a flexible cable according to a first preferred embodiment of the present invention, FIG. 1A being a perspective view, FIG. 1B being an illustration depicting generation of capacitance, and FIG. 1C being an equivalent circuit diagram.

Flexible cables and electronic devices according to some preferred embodiments will hereinafter be described with reference to the drawings. In the drawings, the same elements and portions are provided with the same reference symbols, and repetitions of the same description are avoided.

As illustrated in FIG. 1A, a flexible cable 1A according to a first preferred embodiment of the present invention includes an elongated flexible substrate 10 made of a dielectric material, a first capacitor electrode 11 and a second capacitor electrode 21. The flexible substrate 10 includes a first surface and a second surface on opposite sides thereof. The first capacitor electrode 11 and the second capacitor electrode 21 are arranged on the opposite surfaces, respectively, of the flexible substrate 10, thus defining a capacitor element. The first capacitor electrode 11 is provided on almost the entire first surface of the flexible substrate 10 so as to extend from a first end of the flexible substrate 10 toward a second end of the flexible substrate 10. On an end portion of the capacitor electrode 11, a male connector 12 (first connection portion) is provided. The second capacitor electrode 21 is provided on almost the entire second surface of the flexible substrate 10 so as to extend from the second end of the flexible cable 10 toward the first end of the flexible substrate 10. On an end portion of the capacitor electrode 21, a male connector 22 (second connection portion) is provided. These connectors 12 and 22 are connectors with a surface-mounting configuration.

Figure 1B:
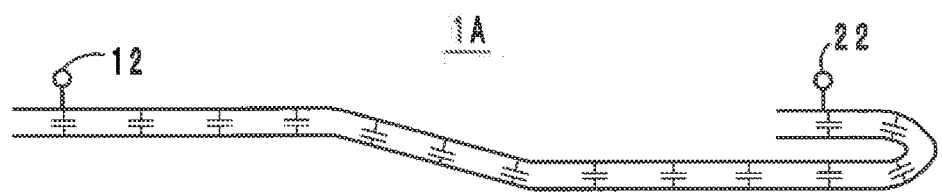
Figure 1C:
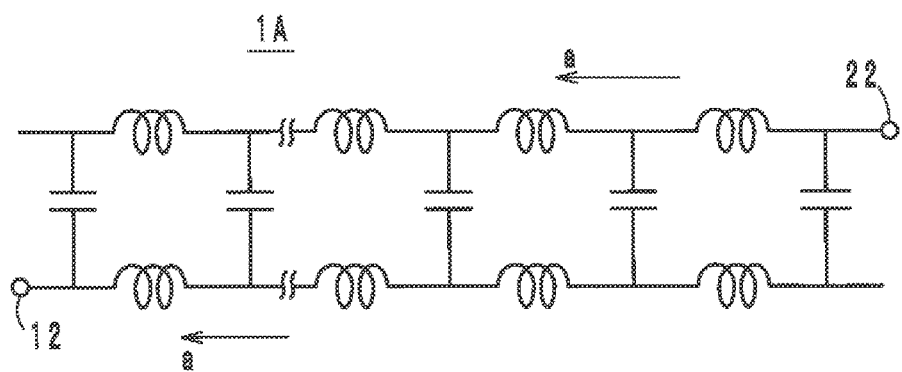

As indicated in FIG. 1B, the flexible cable 1A has a large capacitance area inside. Accordingly, as indicated in FIG. 1C, in the flexible cable 1A, a low-ESL circuit including a plurality of inductors and capacitors is provided, and a high-frequency electric current flows from the connector 22 to the connector 12 in the direction as indicated by arrows a, for example. The flexible cable 1A has a laminate structure including the elongated flexible substrate 10 and the first and the second capacitor electrodes 11 and 12 provided on the first and the second surfaces, respectively, of the flexible substrate 10. Therefore, the flexible cable 1A has a simple structure, has high flexibility, and is easy to produce. Also, it is possible to increase the inductance value of the capacitance element by increasing the length and/or the width of the flexible substrate 10. In the first preferred embodiment, especially because the flexible substrate 10 does not include any interlayer connection conductors such as via-hole conductors, the production process is simplified more, and there is no possibility that the flexibility would be significantly diminished.

The flexible substrate 10 preferably is made of thermoplastic resin, such as liquid crystal polymer, polyimide or the like. The capacitor electrodes 11 and 21 preferably are made of a meal foil, such as a copper foil, an aluminum foil or the like.

The flexible cable 1A is preferably obtained from a large-size flexible substrate 10 (mother sheet) laminated with capacitor electrodes 11 and 12 entirely on its front and back surfaces respectively. For example, a dielectric sheet laminated with metal foils on both main surfaces is prepared, and the metal foils on the main surfaces are patterned by photolithography and/or etching. As a result, flexible substrates 10, each including the capacitor electrodes 11 and 12 provided thereon, are obtained. The metal foils are copper foils, for example. Thus, the capacitor electrodes on the both surfaces of the mother sheet are etched into strips, each corresponding to the capacitor electrode 11 or 12 of one flexible cable 1A, and the mother sheet is cut into flexible cables 1A.

Figure 2A:
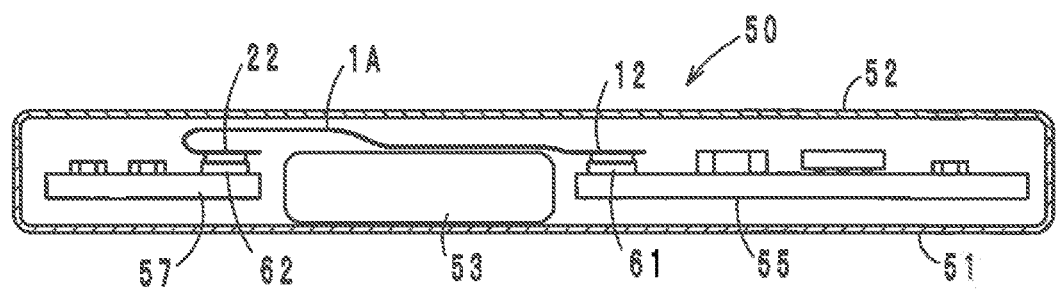
FIGS. 2A and 2B are schematic views of a cell phone including the flexible cable, FIG. 2A being a sectional view and FIG. 2B being a plan view illustrating the inside of a case.
Figure 2B:
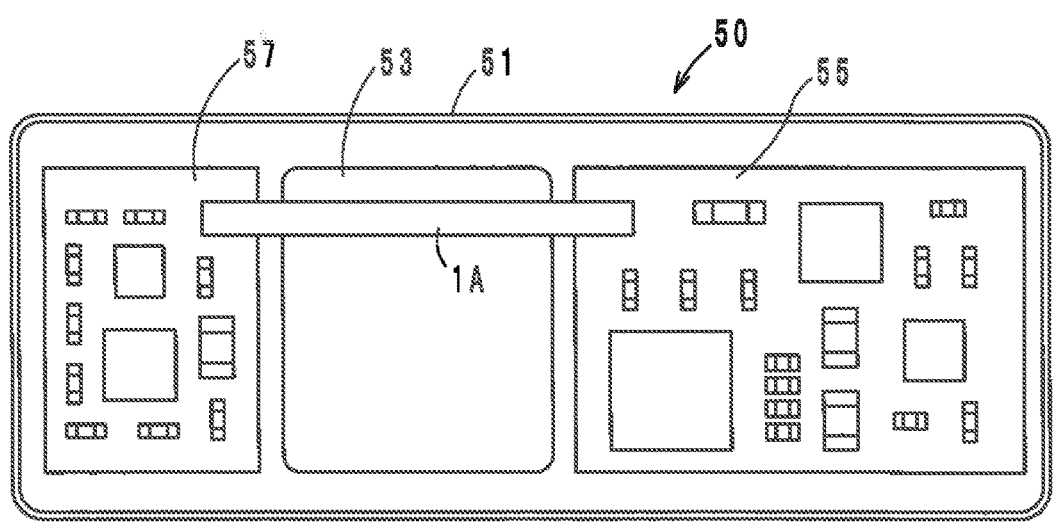

The flexible cable 1A is used, for example, to connect circuit boards 55 and 57 provided in a cell phone 50 as illustrated in FIGS. 2A and 2B via capacitance. The cell phone 50 includes a body 51 and a back-side lid 52. In the body 51, the circuit boards 55 and 57 are arranged with a battery pack 53 therebetween, and various circuit elements are mounted on the circuit boards 55 and 57. The male connectors 12 and 22 of the flexible cable 1A are connected to female connectors 61 and 62 provided on the circuit boards 55 and 57, respectively. Thus, the flexible cable 1A connects the circuit boards 55 and 57 to each other across the battery pack 53.

Figure 3:
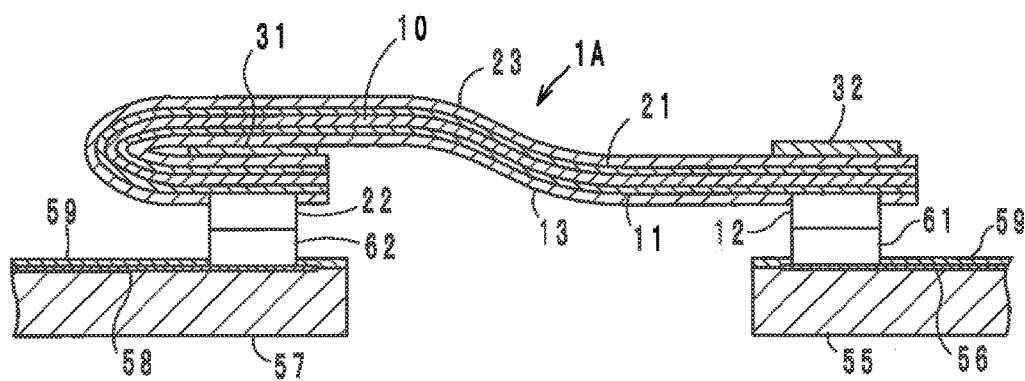
FIG. 3 is a sectional view indicating a first example of attachment of the flexible cable.

As seen in FIG. 3, the flexible cable 1A further includes resist layers 13 and 23 on the surfaces of the capacitor electrodes 11 and 21 except the portions where the connectors 12 and 22 are provided, and the resist layers 11 and 21 define and function as insulating protective films. Thus, the capacitor electrodes 11 and 12 are covered by the resist layers 13 and 23, respectively, which improves the corrosion resistance of the capacitor electrodes 11 and 21 and secures the insulation properties of the capacitor electrodes 11 and 21 from other metal elements or portions. However, the resist layers 13 and 23 are not provided in a portion to be folded so as to secure the flexibility of the portion to be folded.

FIG. 3 is an illustration indicating a first example of attachment of the flexible cable 1A. In the first example of attachment, the first end portion of the flexible cable 1A where the connector 12 is provided is not folded, and the end of the capacitor electrode 11 in the first end portion is connected to the connector 61 provided on the circuit board 55 via the connector 12. The second end portion of the flexible cable 1A where the connector 22 is provided is folded back once, and the end of the capacitor electrode 21 in the second end portion is connected to the connector 62 provided on the circuit board 57 via the connector 22. The connectors 61 and 62 are connected to printed wirings 56 and 58 provided on the circuit boards 55 and 57, respectively, and the printed wirings 56 and 58 are protected by resist layers 59.

In this way, the printed wirings 56 and 58, which are arranged on the respective surfaces of the circuit boards 55 and 57 so as to be substantially on the same level, are connected to each other via the capacitor electrodes 11 and 21 arranged on the front surface and the back surface, respectively, of the flexible cable 1A including no interlayer connection conductors such as via-hole conductors. Thus, folding back the second end portion of the flexible cable 1A once eliminates the necessity of using interlayer connection conductors. Further, the fold line is able to be shifted in the right-left direction from the position indicated in FIG. 3. Accordingly, even if the distance between the circuit boards 55 and 57 changes from the designed value due to an arrangement error, it is possible to cope with the change by shifting the fold line of the flexible cable 1A.

The folded-back second end portion of the flexible cable 1A is bonded together preferably by a double-faced adhesive tape 31, for example. Therefore, even if the flexible cable 1A has elasticity, the second end portion of the flexible cable 1A is prevented from unfolding. Also, the bonding of the folded-back second end portion of the flexible cable 1A improves the strength of the second end portion and facilitates the work for engagement between the connectors 22 and 62. Thus, the flexible cable 1A is preferably folded back such that a connection portion is lapped over and is preferably kept folded. Also, a reinforcing plate 32 made of stainless steel or the like is stuck on the first end portion of the flexible cable 1A so as to facilitate the work for engagement between the connectors 12 and 61. It is possible to use not only a double-faced adhesive tape but also any other adhesive, such as a liquid type adhesive, etc., to keep the folded-back portion in the folded state.

Figure 4:
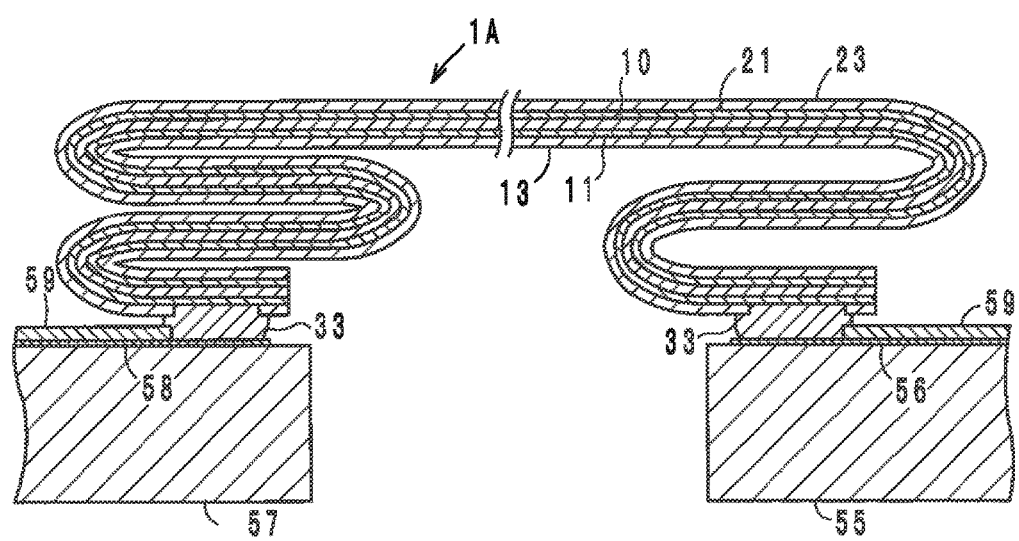
FIG. 4 is a sectional view indicating a second example of attachment of the flexible cable.

FIG. 4 illustrates a second example of attachment of the flexible cable 1A. In the second example, the first end portion of the flexible cable 1A is folded up twice into concertinas, and the end of the capacitor electrode 11 in the first end portion is connected to the printed wiring 56 of the circuit board 55 via a conductive adhesive 33. The second end portion of the flexible cable 1A is folded up thrice into concertinas, and the end of the capacitor electrode 21 in the second end portion is connected to the printed wiring 58 of the circuit board 57 via a conductive adhesive, solder or any other adhesive 33, for example.

When the flexible cable 1A is attached between the circuit boards 55 and 57 arranged substantially on the same level, one of the end portions of the flexible cable 1A is folded back (2n+1) times, and the other end portion of the flexible cable 1A is folded back 2n times, wherein n is zero or a positive integer. Thus, when two portions to be connected to the ends of the flexible cable 1A respectively face in the same direction, the difference between the number of folds in one end portion of the flexible cable 1A and the number of folds in the other end portion of the flexible cable 1A preferably is an odd number.

Figure 5:
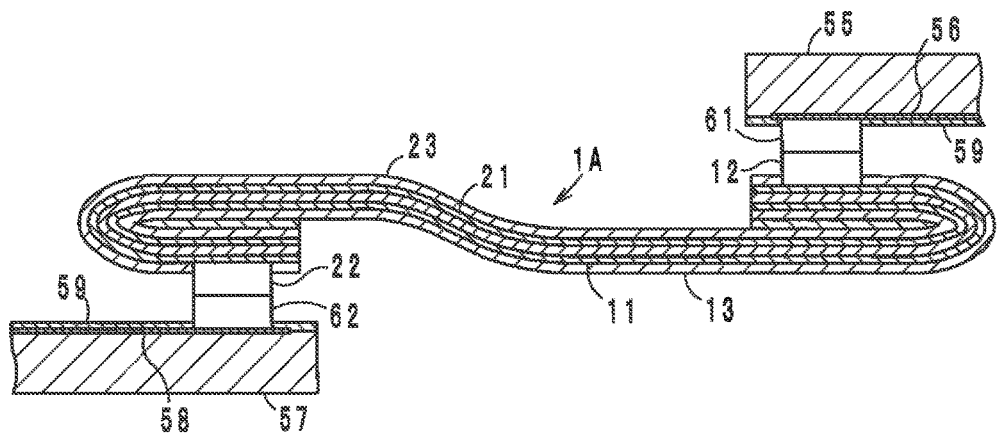
FIG. 5 is a sectional view indicating a third example of attachment of the flexible cable.

FIG. 5 illustrates a third example of attachment of the flexible cable 1A. In the third example, the flexible cable 1A connects the printed wirings 56 and 58 of the circuit boards 55 and 57 arranged to face each other. The first end portion and the second end portion of the flexible cable 1A are folded back the same number of times (in the third example, once). Then, the end of the capacitor electrode 11 in the first end portion is connected to the printed wiring 56 of the circuit board 55 via the connectors 12 and 61, and the end of the capacitor 21 in the second end portion is connected to the printed wiring board 58 of the circuit board 57 via the connectors 22 and 62. When two portions to be connected to the respective ends of the flexible cable 1A face in the opposite directions, it is not always necessary that the number of folds in one end portion of the flexible cable 1A is equal to the number of folds in the other end portion of the flexible cable. In this case, it is preferable that the difference between the number of folds in one end portion of the flexible cable 1A and the number of folds in the other end portion of the flexible cable 1A is an even number.

Figure 6:
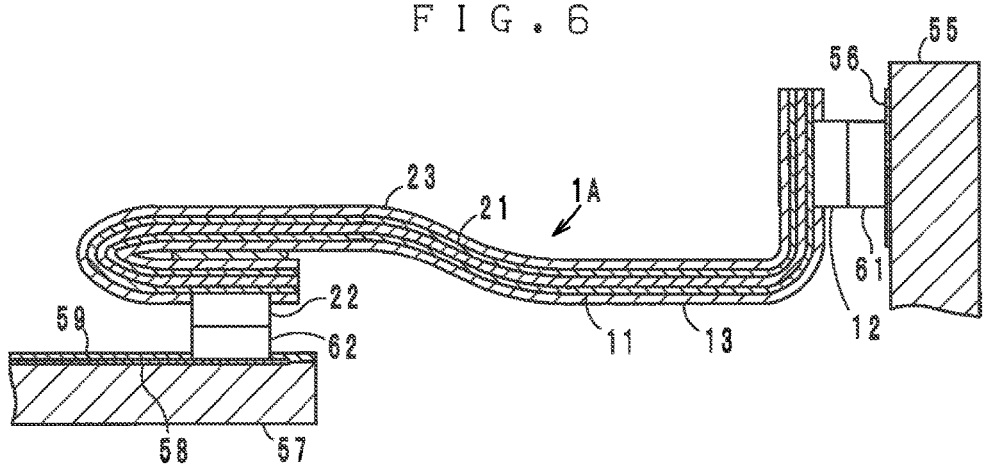
FIG. 6 is a sectional view indicating a fourth example of attachment of the flexible cable.

FIG. 6 illustrates a fourth example of attachment of the flexible cable 1A. In the fourth example, the flexible cable 1A connects the printed wiring 56 of the circuit board 55 arranged vertically to the printed wiring 57 of the circuit board 57 arranged horizontally. The first end portion of the flexible cable 1A is bent substantially at a right angle, and the end of the capacitor electrode 11 in the first end portion is connected to the printed wiring 56 of the circuit board 55 via the connectors 12 and 61. The second end portion of the flexible cable 1A is folded back once, and the end of the capacitor electrode 21 in the second end portion is connected to the printed wiring 58 of the circuit board 57 via the connectors 22 and 62.

Figure 7:
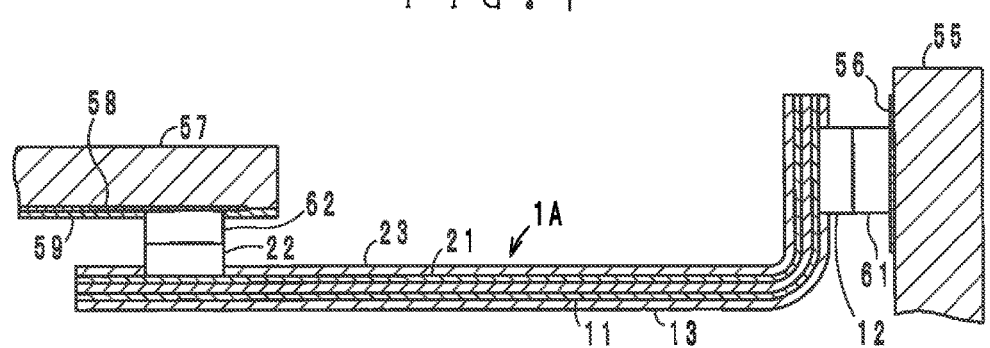
FIG. 7 is a sectional view indicating a fifth example of attachment of the flexible cable.

FIG. 7 is a fifth example of attachment of the flexible cable 1A. In the fifth example, the flexible cable 1A connects the printed wiring 56 of the circuit board 55 arranged vertically to the printed wiring 58 of the circuit board 57 arranged to face downward. The first end of the flexible cable 1A is bent substantially at a right angle, and the end of the capacitor electrode 11 in the first end portion is connected to the printed wiring 56 of the circuit board 55 via the connectors 12 and 61. The second end of the flexible cable 1A is not folded, and the end of the capacitor electrode 21 in the second end portion is connected to the printed wiring 58 of the circuit board 57 via the connectors 22 and 62.

Figure 8:
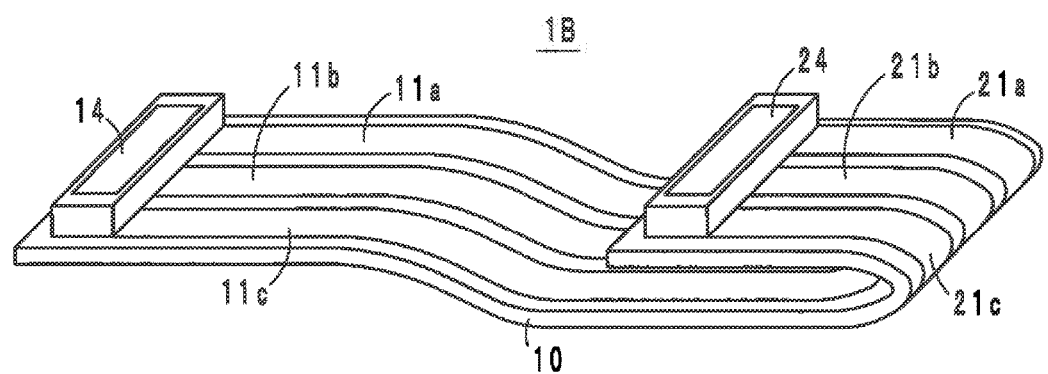
FIG. 8 is a perspective view of a flexible cable according to a modification of a preferred embodiment of the present invention.

FIG. 8 illustrates a flexible cable 1B according to a second preferred embodiment of the present invention. The flexible cable 1B includes an elongated flexible substrate 10 including a first surface and a second surface opposed to each other, three first capacitor electrodes 11a, 11b and 11c provided on the first surface of the flexible substrate 10, and three second capacitor electrodes 21a, 21b and 21c provided on the second surface of the flexible substrate 10. The first capacitor electrodes 11a, 11b and 11c are arranged so as to face the second capacitor electrodes 21a, 21b and 21c, respectively, across the flexible substrate 10. A three-terminal connector 14 is provided on the first capacitor electrodes 11a, 11b and 11c, and a three-terminal connector 24 is provided on the second capacitor electrodes 21a, 21b and 21c. The capacitor electrodes 11a, 11b, 11c, 21a, 21b and 21c may define two circuits or may define three or more circuits. By setting the square measures of the area where the capacitor electrodes 11a and 21a face each other, the area where the capacitor electrodes 11b and 21b face each other and the area where the capacitor electrodes 11c and 21c face each other in the respective circuits to different values, the capacitance values of the respective circuits are able to made different from one another. The flexible cable 1B is able to be attached to the circuit boards 55 and 57 in various ways as described above.

Figure 9:
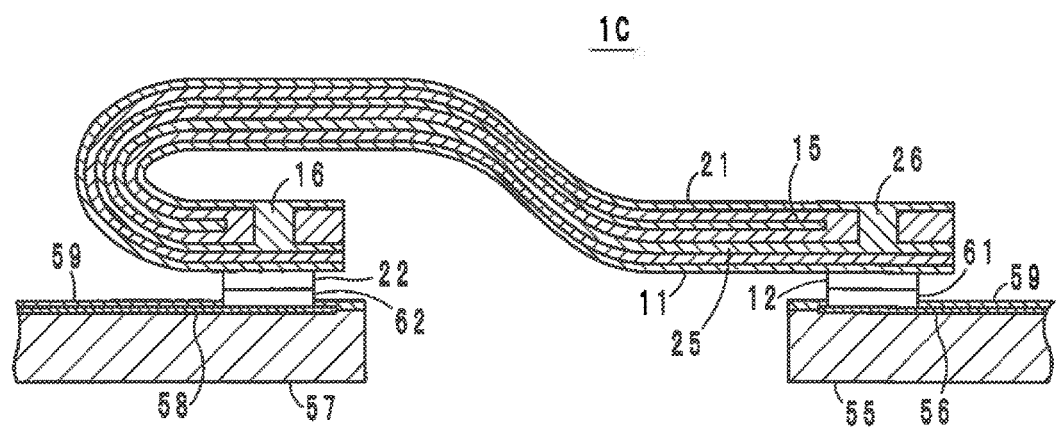
FIG. 9 is a sectional view of a flexible cable according to a third preferred embodiment of the present invention in an attached state.

FIG. 9 illustrates a flexible cable 1C according to a third preferred embodiment of the present invention. The flexible cable 1C includes a multilayer flexible substrate 10 including a first surface and a second surface opposed to each other, a first capacitor electrode provided on the first surface, a second capacitor electrode provided on the second surface, and further capacitor electrodes 15 and 25 extending from one end to the other end inside the flexible cable 10. An end of the first capacitor electrode 11 is connected to an end of the capacitor electrode 15 through a via-hole conductor 16, and an end of the second capacitor electrode 21 is connected to an end of the capacitor electrode 25 through a via-hole conductor 26.

In the third preferred embodiment, the embedded capacitor electrode 15 is maintained at the same electric potential as the first capacitor electrode 11, and the embedded capacitor electrode 25 is maintained at the same electric potential as the second capacitor electrode 21. Accordingly, the electrodes 11 and 15 define and function as the first capacitor electrode, and the electrodes 21 and 25 define and function as the second capacitor electrode. Therefore, a great capacitance value is achieved. The via-hole conductors 16 and 26 are columnar metal portions preferably made of Ag, Cu or the like. There is a possibility that providing such interlayer connection conductors in the flexible substrate 10 would result in deterioration of the flexibility of the substrate 10. In the third preferred embodiment, however, the via-hole conductors 16 and 26 are located in the areas where the connectors 12 and 22 are provided, that is, the via-hole conductors 16 and 26 are located so as to overlap the connection portions from a planar view, and therefore, there is no risk of deteriorating the flexibility of the substrate 10. In the third preferred embodiment, the via-hole conductors 16 and 26 improve the rigidity of the connection portions, and providing the via-hole conductors 16 and 26 is preferred.

According to the preferred embodiments described above, the connectors 12 and 22 preferably are provided on the opposite surfaces of the cable. However, the connectors 12 and 22 may be provided on the same surface of the cable, and in this case, an interlayer connection conductor such as a via-hole conductor as described in the third preferred embodiment may be provided.

Figure 10A:
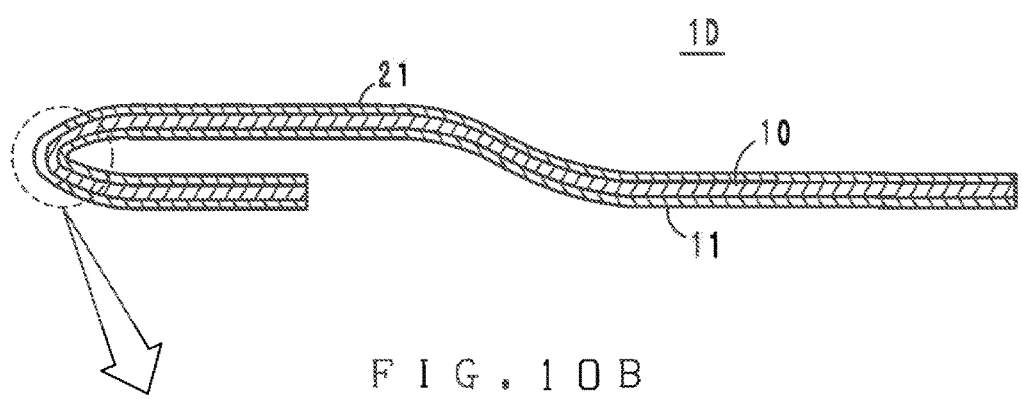
FIGS. 10A and 10B illustrate a flexible cable according to a fourth preferred embodiment of the present invention, FIG. 10A being a sectional view and FIG. 10B being an exploded perspective view of a portion Y.
Figure 10B:
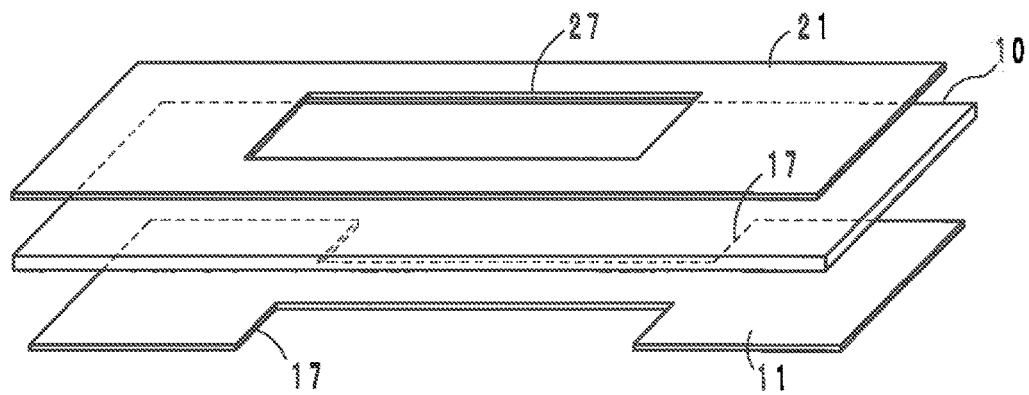

FIGS. 10A and 10B illustrate a flexible cable 1D according to a fourth preferred embodiment of the present invention. In the flexible cable 1D, near the fold in the second end portion, an opening 27 is provided in the second capacitor electrode 21, and cuts 17 are provided on both sides of the first capacitor electrode 11. In a fold portion, the capacitance value is likely to change according to the expansion of the flexible substrate 10. In the fourth preferred embodiment, the capacitor electrodes 11 and 21 do not face each other in the fold portion, and accordingly, no capacitance is generated between the capacitor electrodes 11 and 21 in the fold portion. Therefore, there is no risk of capacitance changes in the fold portion of the flexible cable 1D.

Besides setting the square measure of the area where the capacitor electrodes 21 and 11 face each other in the fold portion to zero, other ways of significantly reducing or minimizing capacitance changes in the fold portion are possible. For example, the capacitance value in the fold portion may be set smaller than the capacitance value in other portions by decreasing the width of one of the capacitor electrodes 11 and 21 in the fold portion.

Figure 11A:
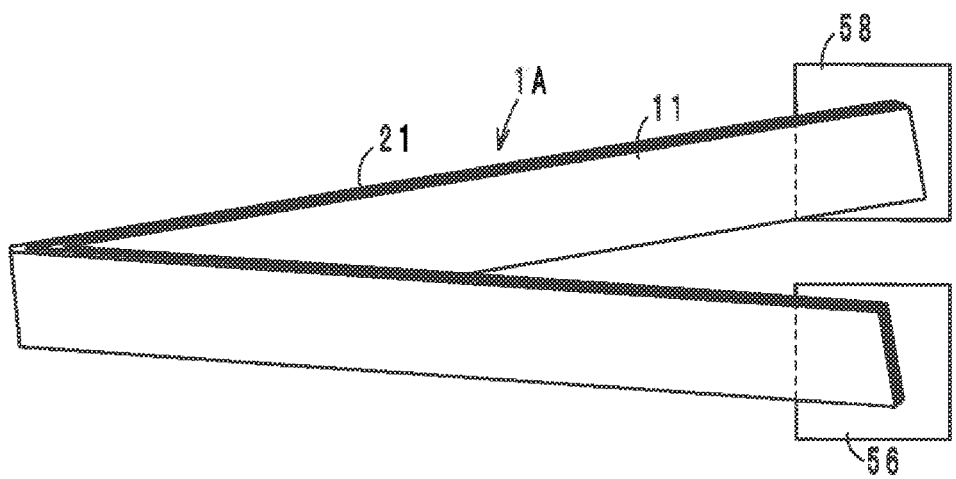
FIGS. 11A and 11B illustrate other examples of attachment of the flexible cable.

As illustrated in FIG. 11A, the flexible cable 1A may be folded once in a center portion thereof and connected to the printed wirings 56 and 58 of the circuit boards. If the printed wirings 56 and 58 are on the same level, an end of the first capacitor electrode 11 is connected to the printed wiring 56, and an end of the second capacitor electrode 21 is connected to the printed wiring 58.

Figure 11B:
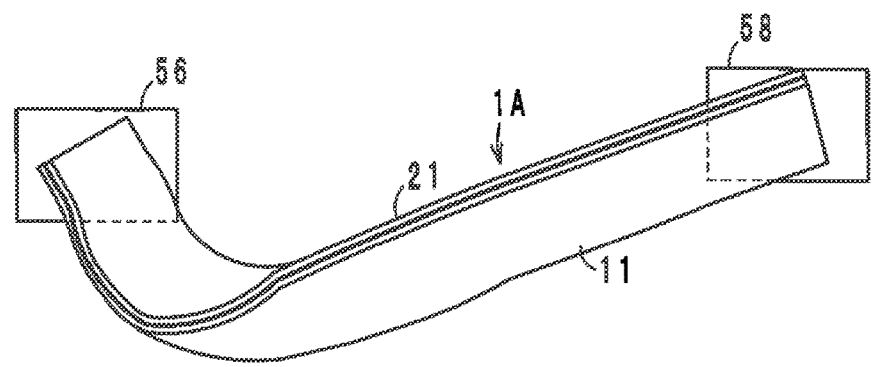

As illustrated in FIG. 11B, the flexible cable 1B may be twisted once and connected to the printer wirings 56 and 58. If the printed wirings 56 and 58 are on the same level, an end of the first capacitor electrode 11 is connected to the printed wiring 56, and an end of the second capacitor electrode 21 is connected to the printed wiring 58.

Figure 12:
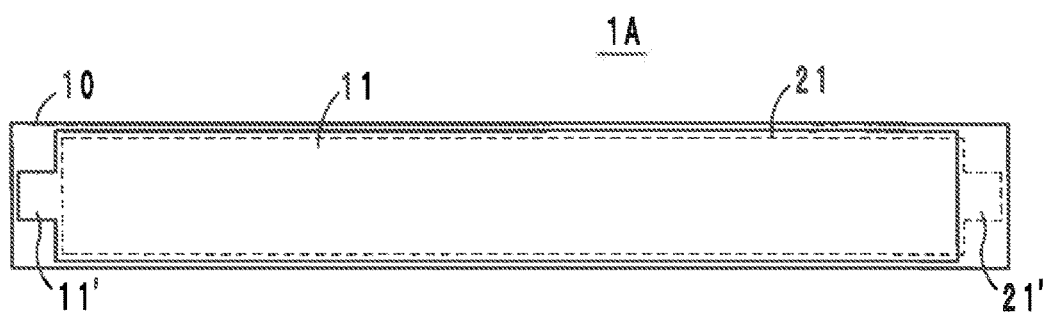
FIG. 12 is a plan view of a flexible cable of another preferred embodiment of the present invention.

As illustrated in FIG. 12, in the flexible cable 1A, it is not always necessary that the capacitor electrodes 11 and 12 are provided almost entirely on the first and the second surfaces, respectively, on the flexible substrate 10. For example, as illustrated in FIG. 12, respective end portions of the first and the second capacitor electrodes 11 and 21 may be made narrower, and these end portions may be used as a first narrow connection portion 11' and a second narrow connection portion 21', respectively.

Other Preferred Embodiments

Flexible cables and electronic devices according to the present invention are not limited to the preferred embodiments described above, and various changes and modifications are possible.

For example, the detailed structure and the shape of the capacitor electrodes may be arbitrarily designed. The structures, the shapes and the arrangement of the circuit boards to be connected to each other by a flexible cable may be designed arbitrarily. The electronic device in which the flexible cable is to be provided is not limited to a cell phone. The circuit elements to which the first connection portion and the second connection portion of the flexible cable are to be connected may be circuit patterns provided on the case of an electronic device as well as circuit boards. The circuit elements to be connected to each other by the flexible cable may be arranged on the same substrate or on the same case.

As thus far described, various preferred embodiments of the present invention are applicable to flexible cables and electronic devices, and are useful especially in simplifying the structures of flexible cables and electronic devices, facilitating a production process thereof, permitting sufficient flexibility thereof and increasing the capacitance thereof.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A capacitor comprising:
   a flexible substrate including a first surface and a second surface on opposite sides thereof;
   a first capacitor electrode provided on the first surface side of the flexible substrate, the first capacitor electrode extending from a first end of the flexible substrate toward a second end of the flexible substrate;
   a second capacitor electrode provided on the second surface side of the flexible substrate, the second capacitor electrode extending from the second end of the flexible substrate toward the first end of the flexible substrate;
   a first connection portion provided at an end of the first capacitor electrode located at the first end of the flexible substrate; and
   a second connection portion provided at an end of the second capacitor electrode located at the second end of the flexible substrate; wherein
   the first connection portion and the second connection portion are capable of being connected to an electric conductor provided on a first circuit element and an electric conductor provided on a second circuit element, respectively, the first circuit element and the second circuit element being separate bodies from the flexible substrate;
   the first capacitor electrode and the second capacitor electrode face each other across the flexible substrate and define a capacitor element;
   the flexible substrate includes a specified area that is a part of an area between the first connection portion and the second connection portion;
   the first capacitor electrode and the second capacitor electrode are disposed to extend through the specified area in a length direction of the flexible substrate;
   in the specified area, the first capacitor electrode and the second capacitor electrode do not face each other; and
   the flexible substrate is bent at the specified area.

2. The capacitor according to claim 1, wherein the flexible capacitor does not include any circuit elements other than the capacitor element.

3. The capacitor according to claim 1, wherein the flexible capacitor does not include any via-hole conductors.

4. The capacitor according to claim 1, further comprising connectors attached to the first connection portion and the second connection portion, respectively.

5. The capacitor according to claim 1, wherein at least one of the first capacitor electrode and the second capacitor electrode includes electrodes provided in the flexible substrate, the electrodes being connected through a via-hole conductor.

6. The capacitor according to claim 1, wherein at least one of the first end and the second end is folded back.

7. The capacitor according to claim 1, wherein one of the first and the second ends of the flexible substrate is folded back (2n+1) times, and the other of the first and the second ends is folded back 2n times, n being zero or a positive integer.

8. The capacitor according to claim 1, wherein the first end and the second end of the flexible substrate are folded back a same number of times.

9. The capacitor according to claim 1, wherein the flexible substrate is folded in a center portion thereof.

10. The capacitor according to claim 4, wherein an adhesive layer intervenes in a portion where the flexible substrate is folded.

11. The capacitor according to claim 1, wherein a reinforcing plate is provided at least one of the first and the second ends of the flexible substrate.

12. The capacitor according to claim 1, wherein
the first capacitor electrode is provided almost entirely on the first surface side; and
the second capacitor electrode is provided almost entirely on the second surface side.

13. The capacitor according to claim 1, wherein a plurality of first capacitor electrodes and a plurality of second capacitor electrodes are provided to define a plurality of pairs of first and second capacitor electrodes facing each other across the flexible substrate.

14. The capacitor according to claim 1, wherein
an opening is provided in the second capacitor electrode;
cuts are provided on both sides, in a widthwise direction, of the first capacitor electrode; and
in an area where the opening and the cuts are located, the first capacitor electrode and the second capacitor electrode do not face each other.

15. The capacitor according to claim 1, wherein one of the first capacitor electrode and the second capacitor electrode includes a narrowed portion having a smaller width than any other portion.

16. An electronic device comprising:
a capacitor including:
a flexible substrate including a first surface and a second surface on opposite sides thereof;
a first capacitor electrode provided on the first surface side of the flexible substrate, the first capacitor electrode extending from a first end of the flexible substrate toward a second end of the flexible substrate;
a second capacitor electrode provided on the second surface side of the flexible substrate, the second capacitor electrode extending from the second end of the flexible substrate toward the first end of the flexible substrate;
a first connection portion provided at an end of the first capacitor electrode located at the first end of the flexible substrate; and
a second connection portion provided at an end of the second capacitor electrode located at the second end of the flexible substrate;
a first circuit element which the first connection portion is connected to; and
a second circuit element which the second connection portion is connected to; wherein
the first connection portion and the second connection portion are connected to an electric conductor provided on the first circuit element and an electric conductor provided on the second circuit element, respectively, the first circuit element and the second circuit element are separate bodies from the flexible substrate;
the first capacitor electrode and the second capacitor electrode face each other across the flexible substrate and define a capacitor element;
the flexible substrate includes a specified area that is a part of an area between the first connection portion and the second connection portion;
the first capacitor electrode and the second capacitor electrode are disposed to extend through the specified area in a length direction of the flexible substrate;
in the specified area, the first capacitor electrode and the second capacitor electrode do not face each other; and
the flexible substrate is bent at the specified area.

17. The electronic device according to claim 16, further comprising connectors attached to the first connection portion and the second connection portion, respectively.

18. The electronic device according to claim 16, wherein at least one of the first end and the second end is folded back.

* * * * *